(12) United States Patent
Blosse

(10) Patent No.: US 6,682,996 B1
(45) Date of Patent: Jan. 27, 2004

(54) METHOD FOR FORMING A SEMICONDUCTOR STRUCTURE USING A DISPOSABLE HARDMASK

(75) Inventor: Alain P. Blosse, Belmont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/185,317

(22) Filed: Jun. 28, 2002

(51) Int. Cl.$^7$ .............................. H01L 21/467
(52) U.S. Cl. ................. 438/586; 438/595; 438/736; 438/738
(58) Field of Search ................. 438/586, 595, 438/671, 717, 736, 738

(56) References Cited

U.S. PATENT DOCUMENTS

| | | | | |
|---|---|---|---|---|
| 5,442,237 A | * | 8/1995 | Hughes et al. | 257/759 |
| 5,670,423 A | * | 9/1997 | Yoo | 438/587 |
| 6,136,679 A | * | 10/2000 | Yu et al. | 438/592 |
| 6,140,226 A | * | 10/2000 | Grill et al. | 438/637 |
| 6,156,485 A | * | 12/2000 | Tang et al. | 430/313 |
| 6,319,824 B1 | * | 11/2001 | Lee et al. | 438/639 |
| 6,342,452 B1 | * | 1/2002 | Coronel et al. | 438/710 |
| 6,420,099 B1 | * | 7/2002 | Gutsche et al. | 430/318 |
| 6,458,284 B1 | * | 10/2002 | Kashihara | 216/47 |
| 6,479,391 B2 | * | 11/2002 | Morrow et al. | 438/706 |
| 6,498,080 B1 | * | 12/2002 | Chittipeddi et al. | 438/585 |

* cited by examiner

Primary Examiner—Wael Fahmy
Assistant Examiner—Stephen W. Smoot
(74) Attorney, Agent, or Firm—Kevin L. Daffer; Conley, Rose P.C.

(57) ABSTRACT

A method is provided, which includes patterning a stack of layers spaced below a sacrificial hardmask layer. In some embodiments, the method may include patterning a lower hardmask layer arranged above the stack of layers. Such a patterning process may include removing the entire sacrificial hardmask layer. For example, the method may include patterning an upper portion of the stack of layers using the sacrificial hardmask layer as a first mask and patterning a lower portion of the stack of layers using the lower hardmask layer as a second mask. Consequently, a semiconductor topography is provided herein which includes a sacrificial hardmask layer arranged above a plurality of layers. Such a sacrificial hardmask layer may include a material with substantially different etch characteristics than one or more upper layers of the plurality of layers and substantially similar etch characteristics as one or more lower layers of the plurality of layers.

20 Claims, 3 Drawing Sheets

METHOD FOR FORMING A SEMICONDUCTOR STRUCTURE USING A DISPOSABLE HARDMASK

BACKGROUND OF THE INVENTION

1. Field of the Invention

This invention relates to semiconductor device manufacturing, and more particularly, to an improved method for patterning a semiconductor feature.

2. Description of the Related Art

The following descriptions and examples are not admitted to be prior art by virtue of their inclusion within this section.

At various stages in the fabrication of semiconductor devices, it may be necessary to pattern one or more layers to form a semiconductor feature, such as a gate structure or an interconnect, for example. In an embodiment in which a semiconductor feature is conductive, contacts may be fabricated to contact the semiconductor feature. In addition or alternatively, portions of the semiconductor feature may need to be insulated from contacts or other conductive structures, which are not intended for contact with the semiconductor feature. For example, an upper surface of a gate structure may need to be insulated from an overlying interconnect line such that shorting the gate may be prevented. Such an insulation configuration may be particularly useful in an embodiment in which the interconnect line is connected to a contact structure formed self-aligned to the gate structure. As such, in some embodiments, forming a semiconductor feature may include etching a conductive layer along with a dielectric layer arranged above or below the conductive layer. In addition or alternatively, some conductive features include multiple conductive layers. Furthermore, some conductive features include barrier layers interposed between multiple conductive layers and/or dielectric layers to prevent the diffusion of dopants to underlying or overlying layers.

In any embodiment, such an inclusion of additional layers may increase the aspect ratio of semiconductor features. An aspect ratio as used herein generally describes the ratio between the height and width of a semiconductor feature when viewed in cross section. Furthermore, as the device densities of semiconductor devices are continually being increased, profile and dimension requirements of semiconductor device features must be further optimized. For example, the lateral dimensions of semiconductor features are continually being reduced in order to increase the device density on a semiconductor substrate. Generally, however, the height of semiconductor features may not be reduced in proportion to the lateral dimensions. In this manner, the aspect ratio of semiconductor features in advanced semiconductor devices may be higher than semiconductor devices with a low density of features.

In general, conventional photolithography and etch processes used to pattern a semiconductor feature may be limited in their abilities to form features with high aspect ratios. In particular, the lateral widths of semiconductor features may be limited by the image resolution of photolithography equipment used to pattern the semiconductor feature. Such image resolution is typically dependent on the wavelength of the photolithographic tool. For example, the minimum resolvable feature size of a 193 nm photolithographic tool may be approximately 0.1 microns. As such, in order to obtain a structure with a feature size with a dimension smaller than approximately 0.1 microns, a smaller wavelength tool may need to be used.

However, there are disadvantages with using smaller wavelength photolithographic tools. For example, photolithographic tools are typically expensive and therefore, purchasing new photolithographic tools for each new development of devices with reduced feature sizes may be cost prohibitive. Furthermore, smaller wavelength photolithographic tools used to produce such devices may require substantial process development to produce such small feature sizes. In addition, the materials used for photoresist films and underlying anti-reflective coating (ARC) layers may be dependent on the wavelength used with the photolithographic tool and therefore, may need to be revised for consistency with the new photolithographic tools. In some cases, problems, such as poor image resolution, poor etch selectivity, or patterning clarity such as line edge roughness, may arise with such immature technologies and chemistries. As a result, the installation of new photolithographic equipment and its associated chemistry may delay the development of devices with reduced feature sizes.

In addition, the thickness of resist layers and ARC layers which are able to be patterned by photolithography equipment is generally reduced as the lateral dimension resolvable by the photolithography equipment is reduced. For example, in some embodiments, the maximum thickness of a resist layer may be approximately 3000 angstroms and the maximum thickness of an ARC layer may be approximately 900 angstroms when using a 193 nm photolithographic tool. As such, in some embodiments, the height of the semiconductor feature may be reduced during the formation of the feature since the mask layer (i.e., the resist layer and ARC layer combined) will be removed prior to the completion of the etch process.

Such a reduction in height may reduce the thickness of one or more layers within the semiconductor feature beyond its design specification. As a result, the height reduction of the semiconductor feature may alter the functionality of a subsequently formed semiconductor device, rendering the device defective or non-functional. For example, the thickness of the conductive portions of a semiconductor feature may be reduced by such a formation process. Such a reduction in thickness of a conductive portion may undesirably increase the resistance of the semiconductor feature, thereby degrading the functionality of the device. Additionally or alternatively, the dielectric portions of a semiconductor feature may be reduced. In such an embodiment, the reduction in dielectric thickness may not allow adequate insulation of the conductive portions of the semiconductor device. Consequently, a reduction in dielectric thickness may undesirably allow a conductive feature to short to the conductive portions of the semiconductor feature.

It would therefore be desirable to develop a method for fabricating a semiconductor feature such that portions of the semiconductor feature are not reduced beyond their design specifications. In particular, it may be desirable to develop a method for patterning a semiconductor feature with relatively large aspect ratios.

SUMMARY OF THE INVENTION

The problems outlined above may be in large part addressed by a method for processing a semiconductor topography. In particular, the method may include patterning a plurality of layers spaced below a sacrificial hardmask layer. In some embodiments, the method may include depositing the sacrificial hardmask layer above a lower hardmask layer arranged above a stack of layers prior to patterning the stack of layers. Accordingly, in some embodiments, the method may minimize the removal of the lower hardmask layer during the patterning process of the stack of layers. In some cases, the patterning process may include removing the entire sacrificial hardmask layer. In particular, the method may include patterning an upper portion of the stack of layers using the sacrificial hardmask layer as a first mask and patterning a lower portion of the stack of layers using the lower hardmask layer as a second mask. In other embodiments, patterning the lower portion of the plurality of layers may include removing the sacrificial hardmask layer. In yet other embodiments, patterning the upper and lower portions of the plurality of layers may both include removing portions of the sacrificial hardmask layer. Consequently, a semiconductor topography is provided herein which includes a first hardmask layer arranged upon and in contact with a plurality of layers and a sacrificial hardmask layer arranged upon and in contact with the first hardmask layer. Such a sacrificial hardmask layer may include substantially different etch characteristics than one or more upper layers of the plurality of layers and substantially similar etch characteristics as one or more lower layers of the plurality of layers.

As stated above, a method for processing a semiconductor topography is contemplated herein which includes patterning a plurality of layers spaced below a sacrificial hardmask layer. In some cases, the method may include patterning one or more upper layers of the plurality of layers. In addition, the method may include patterning a lower layer of the plurality of layers arranged below the one or more upper layers. Patterning the one or more upper layers, in some embodiments, may include exposing the semiconductor topography to an etch chemistry that is more etch selective to the sacrificial hardmask layer than the one or more upper layers. On the other hand, patterning the lower layer may include exposing the semiconductor topography to an etch chemistry that is substantially equally etch selective to the sacrificial hardmask layer and the lower layer. In this manner, patterning the plurality of layers may include removing the sacrificial hardmask layer while patterning the lower layer. In other cases, patterning the plurality of layers may include removing the entire sacrificial hardmask layer while patterning the one or more upper layers. In such an embodiment, patterning the plurality of layers may include patterning an upper portion of a stack of layers using the sacrificial hardmask layer as a first mask and patterning a lower portion of the stack of layers using a lower hardmask layer as a second mask. As such, in some cases, the method may include depositing the sacrificial hardmask layer above a lower hardmask layer arranged above a stack of layers.

Consequently, patterning the plurality of layers may further include removing a portion of the lower patterned hardmask layer interposed between the sacrificial hardmask layer and the plurality of layers. In some embodiments, removing a portion of the lower patterned hardmask layer may include reducing the thickness of the patterned lower hardmask layer to a thickness between approximately 1200 angstroms and approximately 1500 angstroms. Reducing the thickness of patterned lower hardmask layer to such a thickness may be particularly advantageous in an embodiment in which a self-aligned contact structure is to be subsequently formed adjacent to the patterned stack of layers. In any embodiment, larger or smaller thicknesses of lower hardmask layer may be formed during the patterning process of the lower stack of layers, depending on the design specifications of the device. For example, removing a portion of the lower patterned hardmask layer may, in some embodiments, include reducing the thickness of the patterned lower hardmask layer to a thickness of approximately 100 angstroms or greater. In yet other embodiments, removing a portion of the lower hardmask layer may include removing the entirety of the lower hardmask layer.

In some cases, patterning the plurality of layers may include forming a gate structure and the method may include forming spacers aligned to sidewalls of the gate structure. In an embodiment in which a self-aligned contact structure is formed adjacent to the spacers, the patterned lower hardmask layer may include a thickness, for example, that is equal to or greater than approximately 1100 angstroms subsequent to forming the spacers. Such an optimization of thickness of the patterned lower hardmask layer may be particularly advantageous in an embodiment in which a self-aligned contact is to be subsequently formed adjacent to the patterned stack of layers. Other thicknesses of patterned lower hardmask layer, however, may result from such a fabrication process, depending on the design specifications of the device. For example, in some embodiments, the patterned lower hardmask layer may include a thickness, for example, that is equal to or greater than approximately 100 angstroms subsequent to forming the spacers. In yet other embodiments, the lower hardmask layer may be entirely removed subsequent to forming the spacers.

In some embodiments, the method may include patterning the sacrificial hardmask layer using a photoresist mask. In such an embodiment, the sacrificial hardmask layer may be adapted to reduce variations in a reflected signal during patterning of the resist layer. In some cases, the method may further include patterning the lower hardmask layer in alignment with the patterned sacrificial hardmask layer prior to patterning the plurality of layers. In some embodiments, the method may further include removing the photoresist mask prior to patterning the lower hardmask layer. Alternatively, the method may include removing the photoresist mask subsequent to patterning the lower hardmask layer. In yet other embodiments, the method may include removing the photoresist mask while patterning the lower hardmask layer.

Consequently, a semiconductor topography is contemplated herein which may include a first hardmask layer arranged upon and in contact with a plurality of layers. In some embodiments, first hardmask layer may include a dielectric, such as silicon nitride, silicon oxynitride, or nitrided silicon dioxide. In addition or alternatively, the semiconductor topography may further include a sacrificial hardmask layer arranged upon and in contact with the first hardmask layer. In some embodiments, the sacrificial hardmask layer may include substantially different etch characteristics than one or more upper layers of the plurality of layers. In addition or alternatively, the sacrificial hardmask layer may include substantially similar etch characteristics as a lower layer of the plurality of layers. For example, the sacrificial hardmask layer may include polysilicon, in some cases. In other embodiments, the sacrificial hardmask layer may include an alternative material, such as amorphous carbon or tungsten, for example.

In any embodiment, the sacrificial hardmask layer may be adapted to be removed during patterning of the plurality of layers. In addition, the sacrificial hardmask layer may be adapted to reduce the amount of first hardmask layer is removed during patterning of the plurality of layers. In addition, the sacrificial hardmask layer may include a thickness between approximately 100 angstroms and approximately 2000 angstroms prior to patterning the plurality of layers. However, larger or smaller thicknesses of sacrificial hardmask layer may be used depending on the design specifications of the device.

There may be several advantages to processing a semiconductor topography according to the method described herein. For example, a semiconductor structure may be formed with layers comprising thicknesses within the design specifications of the structure. In particular, a semiconductor structure may be formed with conductive layer and dielectric thicknesses within the design specifications of the structure. In this manner, a semiconductor structure formed using the method described herein, in some embodiments, may be adequately insulated. For example, a gate structure may be formed with an adequate dielectric layer thickness formed thereon such that spacers and a self-aligned contact structure may be formed along the sidewalls of the gate structure. Such a method may be particularly useful in fabricating a semiconductor structure with a high aspect ratio. Consequently, the method described herein may be particularly useful in the fabrication of semiconductor devices including sub-micron features.

BRIEF DESCRIPTION OF THE DRAWINGS

Other objects and advantages of the invention will become apparent upon reading the following detailed description and upon reference to the accompanying drawings in which.

Figure 1:
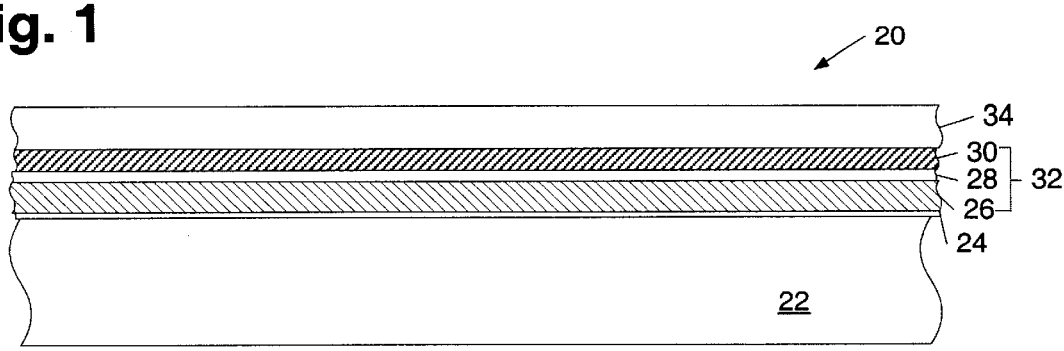
FIG. 1 depicts a partial cross-sectional view of a semiconductor topography including a cap layer arranged upon a stack of layers.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a method for processing a semiconductor topography are shown in FIGS. 1–10. In particular, an exemplary embodiment of a method for patterning a semiconductor structure is provided. FIG. 1 depicts a partial cross-sectional view of semiconductor topography 20 in which a plurality of layers is formed upon and in contact with each other. In particular, semiconductor topography 20 may include dielectric 24 interposed between semiconductor layer 22 and stack of layers 32. In some cases, dielectric 24 may be regarded as part of stack of layers 32. Alternatively, dielectric 24 may be considered separate from stack of layers 32. In addition, semiconductor topography 20 may include cap layer 34 formed upon stack of layers 32. In some embodiments, semiconductor topography 20 may include additional layers formed upon and in contact with one or more of the layers shown in FIG. 1. Alternatively, semiconductor topography 20 may include fewer layers than shown in FIG. 1. For example, dielectric 24 may be omitted from semiconductor topography 20, in some embodiments. Additionally or alternatively, one or more layers of stack of layers 32 may be omitted from semiconductor topography 20. As such, it is noted that several layer configurations may be used for the method described herein and semiconductor topography 20 shown in FIGS. 1–10 is merely shown as an exemplary embodiment. In particular, the composition, thickness, number, and arrangement of layers within a semiconductor topography used for the method described herein may differ from that shown in FIGS. 1–10.

Semiconductor layer 22 may be a semiconductor substrate such as a silicon substrate, and may be doped either n-type or p-type. More specifically, semiconductor layer 22 may be a monocrystalline silicon substrate or a silicon-germanium substrate. Alternatively, semiconductor layer 22 may include structures and layers formed upon a semiconductor substrate. The structures and layers may include, but are not limited to, dielectric layers, metallization layers, gate structures, contact structures, vias, or local interconnect wires. In some embodiments, the upper surface of semiconductor layer 22 may include an interlevel dielectric layer formed upon such structures and layers. In addition or alternatively, diffusion regions (not shown) may be formed in semiconductor layer 22. Moreover, semiconductor layer 22 may include isolation regions (not shown). As stated above, dielectric 24 may be formed upon semiconductor layer 22 and below stack of layers 32. In particular, dielectric 24 may serve as a gate dielectric, a "pad" oxide, or an interlevel dielectric formed beneath stack of layers 32. Dielectric 24 may include, for example, silicon dioxide ($SiO_2$), silicon nitride ($Si_xN_y$), silicon dioxide/silicon nitride (ON), silicon dioxide/silicon nitride/silicon dioxide (ONO), or tetraethylorthosilicate glass (TEOS) based silicon dioxide. Dielectric 24 may have a thickness, for example, between approximately 50 angstroms to approximately 5000 angstroms. However, larger and smaller thicknesses of dielectric 24 may be used depending on the specifications of the device.

Layers 26, 28, and 30 may together form stack of layers 32. More specifically, upper layer 30 may be formed above intermediate layer 28, which may be formed above lower layer 26 to form stack of layers 32. In some embodiments, upper layer 30 may be formed upon and in contact with intermediate layer 28. In addition or alternatively, intermediate layer 28 may be formed upon and in contact with lower layer 26. In an alternative embodiment (not shown), stack of layers 32 may include additional layers such as dielectric 24 as discussed above or layers interposed between layers 26, 28, 30, and/or dielectric 24. In either embodiment, lower layer 26 may be formed above dielectric 24. More specifically, lower layer 26 may be formed upon and in contact with dielectric 24. Alternatively, lower layer 26 may be formed upon and in contact with semiconductor layer 22 if dielectric 24 is omitted.

In some embodiments, stack of layers 32 may be used to form a process structure of a subsequently formed device. Such a structure may be a gate conductor or an interconnect line, for example. As such, stack of layers 32 may include a conductive layer. For example, lower layer 26 may include a conductive material such as, doped polysilicon, aluminum, copper, titanium, tungsten, or a metal alloy. In addition or alternatively, intermediate layer 28 and/or upper layer 30 may include a conductive material as discussed in more detail below. In any embodiment, lower layer 26 may have a thickness, for example, between approximately 300 angstroms to approximately 3000 angstroms. Larger or smaller thicknesses of lower layer 26, however, may be appropriate depending on the semiconductor device being formed.

As shown in FIG. 1, intermediate layer 28 may be interposed between lower layer 26 and upper layer 30. In some cases, intermediate layer 28 may serve as a diffusion barrier layer such that impurities in lower layer 26 and upper layer 30 may be prevented from diffusing into upper layer 30 and lower layer 26, respectively. As such, the materials for intermediate layer 28, in such an embodiment, may include, for example, undoped polysilicon, silicon oxide, silicon nitride, silicon oxynitride, silicon dioxide/silicon nitride, or silicon dioxide/silicon nitride/silicon dioxide. As stated above, in some cases, intermediate layer 28 may be conductive such that upper layer 30 and lower layer 26 may be electrically connected to each other. For example, intermediate layer 28 may include a metal or metal nitride layer such as, aluminum, copper, tungsten, titanium, tungsten nitride, or titanium nitride. In either embodiment, intermediate layer 28 may have a thickness, for example, between approximately 50 angstroms and approximately 200 angstroms. However, larger and smaller thicknesses of intermediate layer 28 may be used depending on the specifications of the device.

As stated above, upper layer 30 may include a conductive material such that a structure fabricated from stack of layers 32 may be conductive. In some embodiments, upper layer 30 may be used to decrease the resistance associated with a structure fabricated from stack of layers 32. For example, in an embodiment in which stack of layers 32 is used to form a gate electrode, upper layer 30 may be used to decrease the resistance of the electrode. As such, upper layer 30 may include a low-resistivity material, such as tungsten, tungsten silicide, cobalt silicide, titanium silicide, or nickel silicide, in some embodiments. In addition or alternatively, upper layer 30 may be used to strap subsequently formed gate regions of opposite conductivity type together. In particular, upper layer 30 may provide a conductive path for a p-n junction formed when a polysilicon connection is made to gates of opposite conductivity type. In either embodiment, upper layer 30 may have a thickness between approximately 200 angstroms and approximately 2000 angstroms. Larger or smaller thicknesses of upper layer 30, however, may be appropriate depending on the semiconductor device being formed.

As stated above, cap layer 34 may be formed above stack of layers 32. In particular, cap layer 34 may be formed upon and in contact with stack of layers 32. In some embodiments, cap layer 34 may serve to prevent contact to a conductive portion of a structure subsequently formed from stack of layers 32. For example, in an embodiment in which a gate structure is formed from stack of layers 32, contact to the upper surface of the gate structure may be prevented, thereby preventing a short from occurring through the gate. Consequently, in some embodiments, cap layer 34 may include a dielectric material. Additionally or alternatively, cap layer 34 may serve as an etch stop layer for a structure subsequently formed from stack of layers 32. For example, in an embodiment in which a gate structure is formed from stack of layers 32, cap layer 34 may serve as an etch stop layer during the formation of spacers along the sidewalls of the gate. In such an embodiment, cap layer 34 may protect the upper surface of the gate structure from the etch process used to form the spacers. As such, in some embodiments, cap layer 34 may include a material that has different etch characteristics than the material of the spacers. For example, in an embodiment in which oxide spacers are formed, cap layer 34 may include silicon nitride, silicon oxynitride, or nitrided silicon dioxide. In other embodiments, cap layer 34 may include the same material as the material used to form sidewall spacers of the gate. Consequently, cap layer 34, in such an embodiment, may not serve as an etch stop layer for the formation of the spacers.

In yet other embodiments, cap layer 34 may additionally or alternatively serve as a hardmask layer to protect underlying layers during the formation of a structure from stack of layers 32. In particular, cap layer 34 may protect underlying layers and structures within semiconductor layer 22, dielectric 24, and/or portions of stack of layers 32. In such an embodiment, cap layer 34 may include a material with different etch characteristics than stack of layers 32. In any embodiment, cap layer 34 may have a thickness, for example, from approximately 1300 angstroms to approximately 1800 angstroms. However, larger and smaller thicknesses of cap layer 34 may be used depending on the specifications of the device.

In particular, in some embodiments, the thickness of cap layer 34 may be specified such that a desired thickness may be obtained subsequent to further processing of semiconductor topography 20. For example, in an embodiment in which a gate structure is formed from stack of layers 32, the thickness of cap layer 34 may be optimized such that an adequate thickness may be obtained for protecting the upper surface of the gate structure. For instance, the thickness of cap layer 34, in such an embodiment, may be optimized such that a thickness greater than or equal to approximately 1100 angstroms may be obtained subsequent to patterning stack of layers 32 and the formation of spacers about the patterned stack of layers. Such an embodiment may be particularly advantageous in embodiments in which a contact is subsequently formed self-aligned to the patterned stack of layers. In other embodiments, however, the thickness of cap layer 34 may be optimized such that a thickness greater than or equal to approximately 100 angstroms may be obtained subsequent to patterning stack of layers 32 and the formation of spacers about the patterned stack of layers.

Figure 2:
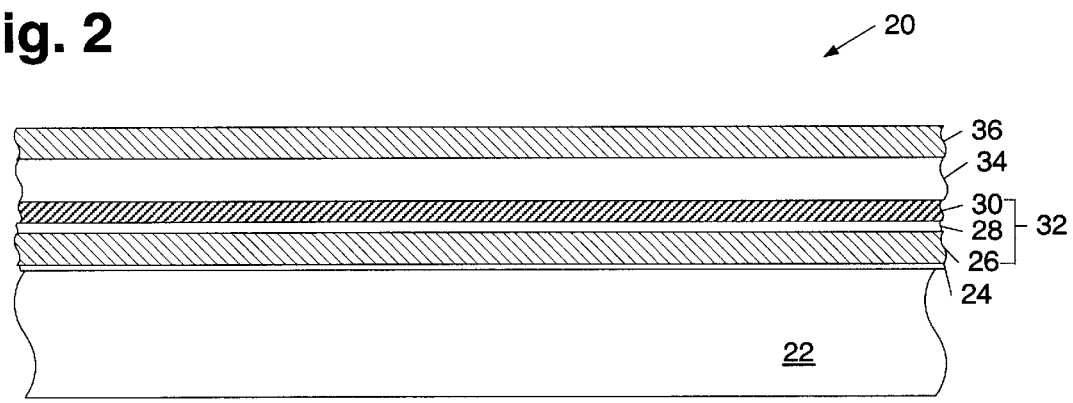
FIG. 2 depicts a partial cross-sectional view of the semiconductor topography in which a sacrificial hardmask layer is formed upon the cap layer of FIG. 1.

FIG. 2 illustrates the formation of sacrificial hardmask layer 36 upon cap layer 34. Such a sacrificial hardmask layer may be used to reduce the amount cap layer 34 is removed during the subsequent patterning of stack of layers 32. As a result, the thickness of cap layer 34 may be formed with a smaller thickness than in an embodiment in which sacrificial hardmask layer 36 is not used to pattern an underlying structure. In this manner, a semiconductor structure may be formed with layer thicknesses within the design specifications of the device. In particular, a semiconductor structure may be formed with adequate insulation upon the upper surface of the structure.

In addition, the reduction of the thickness of cap layer 34 may facilitate a reduced aspect ratio of the patterned layers during the etch process. More specifically, the thickness of the layers patterned during the etch process may be smaller, thereby causing the aspect ratio of the patterned layers during the etch process to be smaller. Aspect ratio, as used herein, may refer to the ratio of height versus width of a given structure or set of layers. In some embodiments, the aspect ratio of layers used to form a patterned structure during the patterning process as described herein may be approximately 20% less than the aspect ratio of layers used to form a patterned structure using conventional patterning processes. In general, the aspect ratio of layers used to pattern underlying layers during an etch process directly affects the contour of the subsequently formed patterned structure. In other words, layers with a relatively small aspect ratio will produce structures with substantially more uniform widths that layers with relatively large aspect ratios. Consequently, the patterning process described herein may yield a structure with more uniform sidewall dimensions.

In general, sacrificial hardmask layer 36 may serve as a hardmask layer to protect underlying portions of semiconductor topography 20 during subsequent patterning of stack of layers 32. Consequently, sacrificial hardmask layer 36 may be adapted to be removed during the patterning of stack of layers 32. In particular, sacrificial hardmask layer 36 may be adapted to be completely removed during the patterning of stack of layers 32. For example, in some embodiments, sacrificial hardmask layer 36 may be adapted to be completely removed during patterning of an upper portion of stack of layers 32. In other embodiments, however, sacrificial hardmask layer 36 may only be adapted to be partially removed during patterning of an upper portion of stack of layers 32. In such an embodiment, however, sacrificial hardmask layer 36 may be adapted such that remaining portions may be completely removed during the patterning of a lower portion of stack of layers 32.

As such, in some embodiments, sacrificial hardmask layer 36 may include a material that has substantially different etch characteristics than one or more upper layers of stack of layers 32 and substantially similar etch characteristics as one or more lower layers of stack of layers 32. For example, sacrificial hardmask layer 36 may include a material that has substantially different etch characteristics than upper layer 30 and/or intermediate layer 28. In addition, sacrificial hardmask layer 36 may include a material that has substantially similar etch characteristics as that of intermediate layer 28 and/or lower layer 26. In this manner, intermediate layer 28 may be considered to be in either the upper or lower portions of stack of layers 32.

In either embodiment, the materials used for sacrificial hardmask layer 36 and stack of layers 32 may be dependent upon each other. For example, in an embodiment in which lower layer 26 includes doped polysilicon, intermediate layer 28 includes tungsten nitride, and upper layer 30 includes tungsten, sacrificial hardmask layer 36 may include polysilicon. In such an embodiment, sacrificial hardmask layer 36 may be doped or undoped. Sacrificial hardmask layer 36 may include polysilicon with other compositions of lower layer 26, intermediate layer 28, and upper layer 30, as well. In other embodiments, sacrificial hardmask layer 36 may include other materials, such as amorphous carbon or tungsten, for example. In yet other embodiments, sacrificial hardmask layer 36 may additionally include a material with properties that aid in minimizing the reflection of energy during a patterning process of a subsequently formed overlying resist layer as described in more detail below in reference to FIG. 3. In addition or alternatively, sacrificial hardmask layer 36 may include a material that is adapted to adhere well to cap layer 34 and/or to layers subsequently formed above sacrificial hardmask layer 36, such as an anti-reflective layer as shown and described in FIG. 3 below.

In addition to the composition of sacrificial hardmask layer 36, the thickness of the layer may be adapted such that sacrificial hardmask layer 36 may be completely or partially removed during patterning of stack of layers 32 and therefore, may be adapted to reduce the amount cap layer 34 is removed during the subsequent patterning of stack of layers 32. Consequently, the thickness of sacrificial hardmask layer 36 may be dependent upon its own composition and the composition of lower layer 26, intermediate layer 28, and upper layer 30. For example, in some embodiments, sacrificial hardmask layer 36 may include a thickness between approximately 100 angstroms and approximately 2000 angstroms. More specifically, sacrificial hardmask layer 36 may include a thickness between approximately 600 angstroms and approximately 1500 angstroms. Larger or smaller thicknesses of sacrificial hardmask layer 36, however, may be appropriate depending on the semiconductor device being formed.

Figure 3:
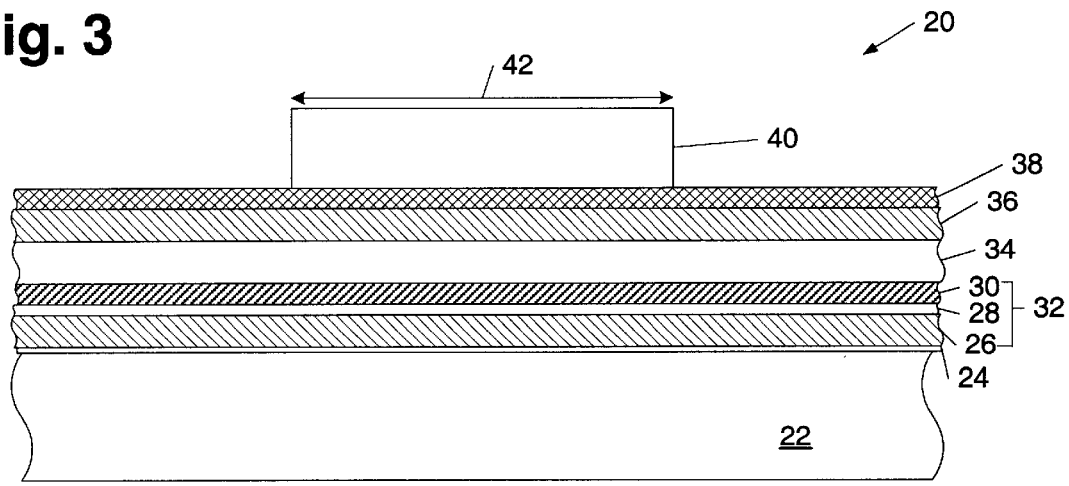
FIG. 3 depicts a partial cross-sectional view of the semiconductor topography in which an anti-reflective layer and resist mask are formed upon the sacrificial hardmask layer of FIG. 2.

FIG. 3 illustrates the formation of anti-reflective layer 38 and resist 40 upon semiconductor topography 20. In particular, anti-reflective layer 38 may be formed above sacrificial hardmask layer 36. Anti-reflective layer 38 preferably includes a material with properties that may aid in producing a profile within overlying resist 40 that meets the design specifications of the device. In other words, the materials used for anti-reflective layer 38 may have properties that aid in minimizing the reflection of energy back toward an energy source and minimizing standing waves within overlying resist 40 during patterning of the resist layer. In some embodiments, anti-reflective layer 38 may include grit organic materials. In other embodiments, anti-reflective layer 38 may include inorganic materials. In either embodiment, the thickness of anti-reflective layer 38 may be between approximately 400 angstroms and approximately 1000 angstroms. However, larger and smaller thicknesses of anti-reflective layer 38 may be used depending on the specifications of the device. In some cases, the thickness of anti-reflective layer 38 may be dependent upon the photolithographic tool used to pattern resist 40. For example, in some embodiments in which a 193 nm photolithographic tool is used, the thickness of anti-reflective layer 38 may between approximately 500 angstroms and approximately 1200 angstroms.

As shown in FIG. 3, resist 40 may be patterned. Such a patterning process may include using lithography techniques known in the semiconductor fabrication industry. Although FIG. 3 illustrates the formation of a single resist mask, any number of resist masks may be formed across semiconductor topography 20 in accordance with design specifications of the device. In addition, the resist masks may be formed with various dimensions and spacings therebetween in accordance with the design specifications of the device. In some embodiments, the method described herein may be particularly advantageous for patterning structures with lateral widths equal to or less than approximately 0.1 microns, since such structures typically have large aspect ratios. In other embodiments, the method described herein may be used for patterning structures with lateral widths greater than approximately 0.1 microns. In either case, resist 40 may be patterned at any width that is in agreement with the design specifications of the fabrication process.

Resist 40 may include a photoresist, such as a deep ultraviolet resist, an I-line resist, a G-line resist, or another resist, such as an e-beam resist or an x-ray resist. In addition, the thickness of resist 40 may be between approximately 1000 angstroms and approximately 6000 angstroms. Larger or smaller thicknesses of resist 40, however, may be used depending on the parameters of the fabrication process. In some embodiments, the thickness of resist 40 may be dependent upon the photolithographic tool used to pattern such a layer. For example, in some embodiments in which a 193 nm photolithographic tool is used, the thickness of resist 40 may between approximately 2000 angstroms and approximately 4000 angstroms. In addition, the thickness of a resist mask used during a patterning process of a given photolithographic tool may directly affect the dimensional resolution of a patterned structure. More specifically, a relatively thin resist layer may allow structures with smaller dimensions to be formed than structures patterned from a relatively thick resist layer. Consequently, it may be advantageous to form resist 40 at a lower end of a thickness range associated with a photolithographic tool. Advantageously, the method described herein may compensate for the inclusion of a relatively small resist thickness by further using sacrificial hardmask layer 36 to pattern an underlying structure. In particular, the inclusion of sacrificial hardmask layer 36 and the etch chemistry used to pattern an underlying structure may allow a relatively thin resist 40 to be used without undesirably etching portions of the layers of the underlying structure.

Figure 4:
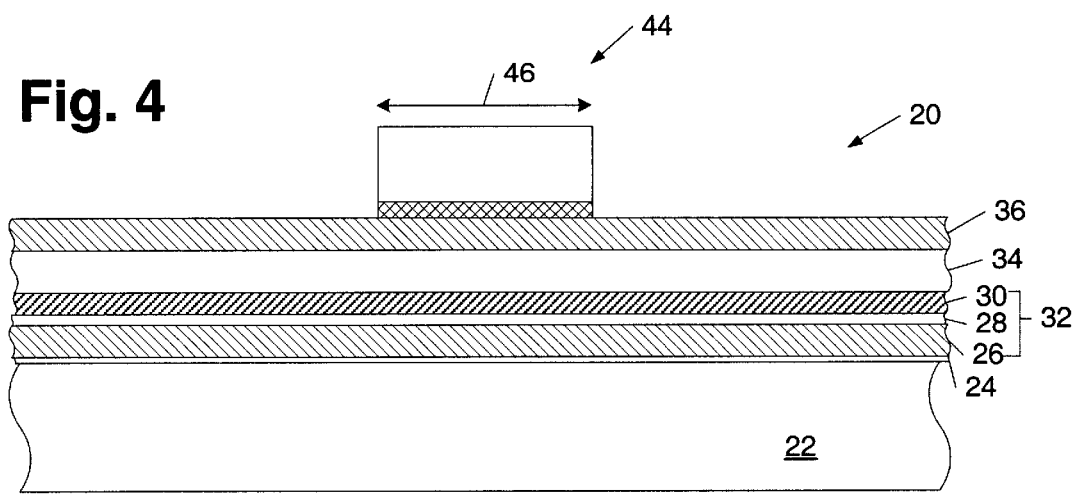
FIG. 4 depicts a partial cross-sectional view of the semiconductor topography in which exposed portions of the anti-reflective layer are removed subsequent to the resist mask formation of FIG. 3.

After patterning resist 40, exposed portions of anti-reflective layer 38 may be etched to form masks 44 as shown in FIG. 4. The etch process may include wet etch and/or dry etch techniques. In addition, the etch chemistry used during the etch process of anti-reflective layer 38 may be selective to the material of sacrificial hardmask layer 36 in order to minimize the amount of sacrificial hardmask layer 36 etched during such a process. For example, in some embodiments, the etch process may include an etch chemistry including $CHF_3$ and/or $CF_4$. However, other chemistries known in the semiconductor fabrication industry for being selective to the material of sacrificial hardmask layer 36 with respect to the material of anti-reflective layer 38 may also be used.

In a preferred embodiment, the etch process may be continued such that anti-reflective layer 38 is "overetched." Such an overetch step may consecutively "trim" remaining portions of resist 40 such that the width, length, and height of resist 40 are reduced. In addition, anti-reflective layer 38 may be etched in alignment with resist 40 such that the width and length of anti-reflective layer 38 are reduced to form mask 44. In this manner, the length and width of mask 44 may be less than the length and width of resist 40. For example, width 46 of mask 44 in FIG. 4 may be less than width 42 of resist 40 in FIG. 3. In general, the amount of the reduction may depend on the trimming process and the design specifications of the device. More specifically, the trimming process may be optimized to decrease the smallest dimension of the structure to a specific percentage of its original dimension. In this manner, structures may be formed having dimensions less than the minimum dimension obtainable by the photolithographic tool used to form the structures.

Figure 5:
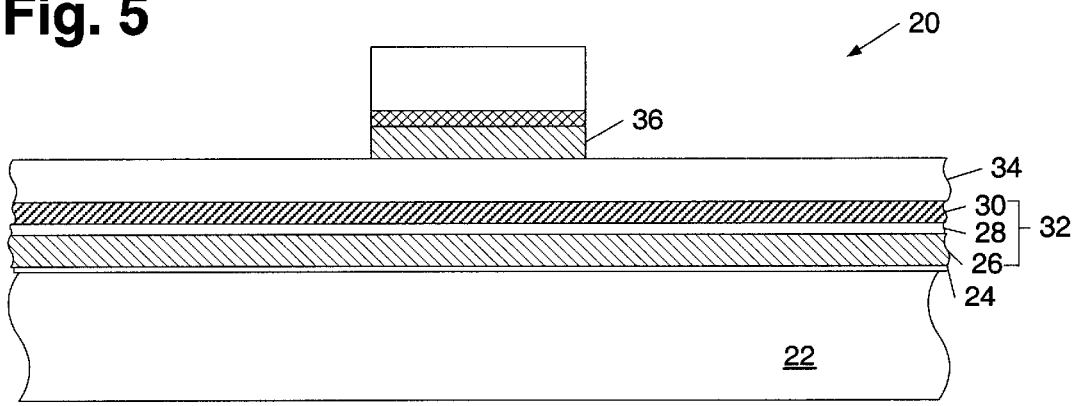
FIG. 5 depicts a partial cross-sectional view of the semiconductor topography in which exposed portions of the sacrificial hardmask layer are removed subsequent to the removal of exposed portions of the anti-reflective layer in FIG. 4.

FIG. 5 illustrates the removal of exposed portions of sacrificial hardmask layer 36 subsequent to the formation of mask 44. Such a removal process may include wet etch and/or dry etch techniques. In addition, the etch chemistry used during the etch process of sacrificial hardmask layer 36 may be selective to the material of cap layer 34 in order to minimize the amount of cap layer 34 etched during such a process. For example, in some embodiments, the etch process may include exposing semiconductor topography 20 to an etch chemistry including chlorine ($Cl_2$) and argon (Ar). In other embodiments, the etch process may include exposing semiconductor topography 20 to an etch chemistry including hydrogen bromide (HBr). Other chemistries known in the semiconductor fabrication industry for being selective to materials of cap layer 34, however, may also be used depending on the materials of sacrificial hardmask layer 36 and cap layer 34.

Figure 6:
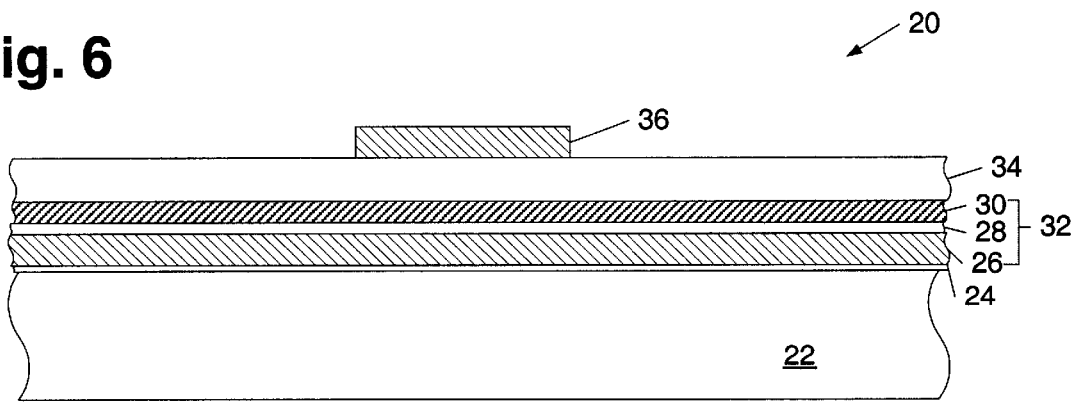
FIG. 6 depicts a partial cross-sectional view of the semiconductor topography in which remaining portions of the anti-reflective layer and resist mask are removed subsequent the patterning of the anti-reflective layer in FIG. 5.

In either embodiment, trimmed resist 40 and anti-reflective layer 38 may be subsequently removed as shown in FIG. 6. Such a removal may be done by a stripping process such as a wet etch or a reactive ion etch stripping process. In some embodiments, resist 40 and anti-reflective layer 38 may be removed from semiconductor topography 20 after patterning sacrificial hardmask layer 36. However, in some cases, it may be advantageous to keep anti-reflective layer 38 and/or resist 40 upon semiconductor topography 20. In particular, it may be advantageous, in some embodiments, to keep anti-reflective layer 38 and/or resist 40 upon semiconductor topography 20 to further protect underlying layers from patterning processes. As such, in an alternative embodiment, trimmed anti-reflective layer 38 and/or resist 40 may not be removed subsequent to etching sacrificial hardmask layer 36. In particular, the method may continue to FIG. 7 subsequent to FIG. 5. In such an embodiment, the thickness of sacrificial layer 36 may be less than in an embodiment in which reflective layer 38 and/or resist 40 have been removed since resist 40 and/or anti-reflective layer 38 may be further used as a mask for the patterning of cap layer 34 and portions of stack of layers 32.

Figure 7:
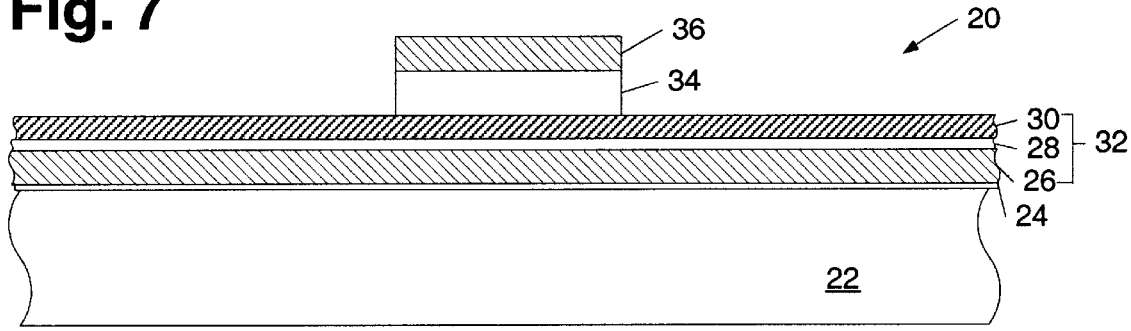
FIG. 7 depicts a partial cross-sectional view of the semiconductor topography in which exposed portions of the cap layer are removed subsequent to the removal of the remaining portions of the anti-reflective layer and the resist mask in FIG. 6.

In either embodiment, the method may continue to FIG. 7 in which cap layer 34 may be patterned in alignment with patterned sacrificial hardmask layer 36. Such a patterning process may include either wet etch and/or dry etch techniques. In addition, the etch chemistry used during the etch process of cap layer 34 may be selective to the material of upper layer 30 in order to minimize the amount of upper layer 30 etched during such a process. For example, in some embodiments, the patterning process may include exposing semiconductor topography 20 to an etch chemistry including $SF_6$, $NF_3$, $CF_4$, or $CH_2F_2$. However, other chemistries known in the semiconductor fabrication industry for being selective to material of upper layer 30 with respect to the material of cap layer 34 may also be used.

Figure 8:
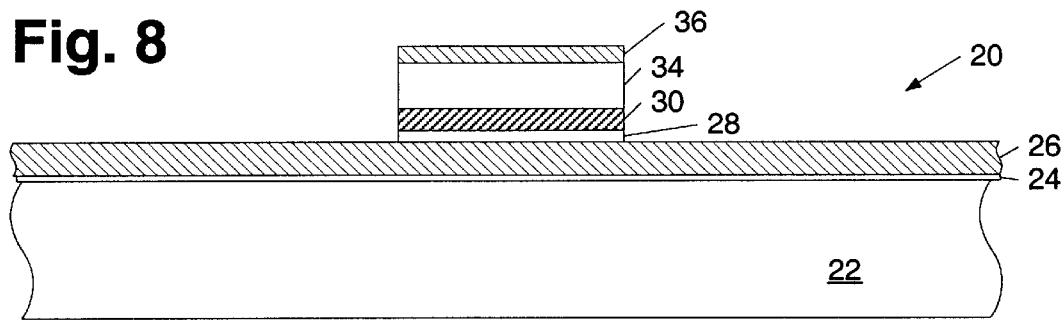
FIG. 8 depicts a partial cross-sectional view of the semiconductor topography in which exposed portions of an upper portion of the stack of layers are removed subsequent to the removal of the exposed portions of the cap layer in FIG. 7.

FIG. 8 illustrates upper layer 30 and intermediate layer 28 patterned in alignment with sacrificial hardmask layer 36. In some embodiments, such a patterning process may be conducted in a single etch step and thus, may include the same etch chemistry. Alternatively, the patterning of upper layer 30 and intermediate layer 28 may include different etch chemistries such that each etch process is distinct from one another. In such an embodiment, intermediate layer 28 may serve as an etch stop for the etch process of upper layer 30. As such, in some embodiments, intermediate layer 28 may be etched along with lower layer 26. Alternatively, intermediate layer 28 may be etched separately from lower layer 26. The etch process of lower layer 26 is described in more detail below in reference to FIG. 9. In either embodiment, the etch chemistry used to pattern upper layer 30 may be selective to the material of sacrificial hardmask layer 36. In some cases, the etch chemistry used to pattern intermediate layer 28 may be additionally selective to the material of sacrificial hardmask layer 36. In this manner, a portion of sacrificial hardmask layer 36 may be removed, as shown in FIG. 8, but the amount of sacrificial hardmask layer 36 removed may be less than that of upper layer 30 or upper layer 30 and intermediate layer 28 combined.

Such an embodiment may be particularly useful when sacrificial hardmask layer 36 and upper layer 30 and/or intermediate layer 28 include materials with substantially different etch characteristics. For example, in some embodiments, upper layer 30 and intermediate layer may include tungsten and tungsten nitride, respectively, and sacrificial hardmask layer 36 may include polysilicon. Depending on the etch chemistry applied to semiconductor topography 20 in such an embodiment, the etch selectivity between sacrificial hardmask layer 36 and upper layer 30 and intermediate layer 28 may be approximately 2:1. As such, upper layer 30 and intermediate layer 28 may be etched twice as fast as sacrificial hardmask layer 36 in such an embodiment. Etch chemistries exhibiting such an etch selectivity may include $SF_6$ and/or $NF_3$, for example. Other etch chemistries and/or layer materials, however, may be used to obtain such an etch selectivity or other etch selectivities depending on the design specifications of the device.

As explained above, sacrificial hardmask layer 36 may be either partially or completely removed during the patterning process of stack of layers 32. As such, in some embodiments, the patterning process of stack of layers 32 and sacrificial hardmask layer 36 may be adapted to remove portions of sacrificial hardmask layer 36 while patterning an upper portion of stack of layers 32. In such an embodiment, the patterning process of stack of layers 32 and sacrificial hardmask layer 36 may be further adapted to remove remaining portions of sacrificial hardmask layer 36 while patterning a lower portion of stack of layers 32. In some embodiments, the thickness of sacrificial hardmask layer 36 may be less than the thickness of intermediate layer 28 and/or lower layer 26. In this manner, sacrificial hardmask layer 36 may be removed during the patterning process of stack of layers 32. In particular, remaining portions of sacrificial hardmask layer 36 may be removed while patterning a lower portion of stack of layers 32.

Figure 9:
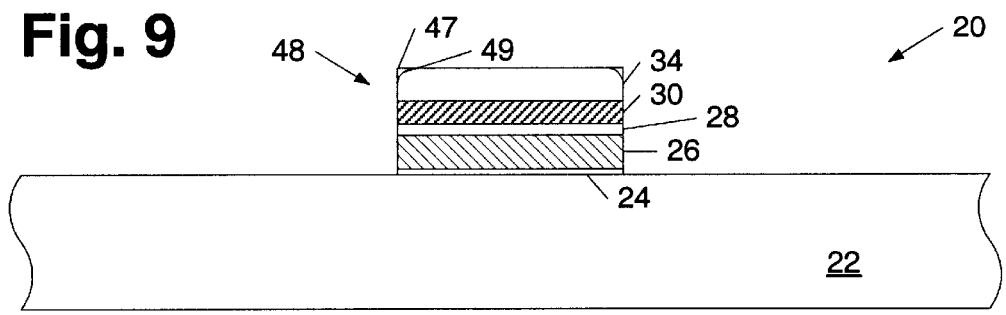
FIG. 9 depicts a partial cross-sectional view of a portion of the semiconductor topography in which exposed portions of a lower portion of the stack of layers are removed subsequent to the removal of the exposed portions of the upper portion of the stack of layers in FIG. 8.

In an alternative embodiment, patterning intermediate layer 28 may include exposing semiconductor topography 20 to an etch chemistry that is substantially equally selective to both intermediate layer 28 and sacrificial hardmask layer 36. Likewise, patterning lower layer 26 may include exposing semiconductor topography 20 to an etch chemistry that is substantially equally selective to both lower layer 26 and sacrificial hardmask layer 36. Semiconductor topography 20 subsequent to the patterning process of lower layer 26 is shown in FIG. 9. In this manner, sacrificial hardmask layer 36 and lower layer 26 and/or intermediate layer 28 may be etched at approximately the same rate. Such an embodiment may be particularly useful when sacrificial hardmask layer 36 and lower layer 26 and/or intermediate layer 28 include materials with substantially similar etch characteristics. In some cases, etch chemistries used for patterning lower layer 26 and/or intermediate layer 28, in such an embodiment, may include $Cl_2$ or a form thereof. In other embodiments, the etch chemistries used to pattern lower layer 26 and/or intermediate layer 28 may include HBr. However, other chemistries known in the semiconductor fabrication industry for being selective to materials of sacrificial hardmask layer 36 and lower layer 26 and/or intermediate layer 28 may also be used.

As stated above, sacrificial hardmask layer 36 is preferably removed during the patterning process of stack of layers 32. In particular, in an embodiments in which sacrificial hardmask layer 36 includes a conductive material, such as but not limited to doped polysilicon or tungsten as described above, it may be advantageous to remove all of sacrificial hardmask layer 36 during the patterning process of stack of layers 32 to prevent shorting with underlying or subsequently formed overlying conductive layers. Since the patterning process of upper layer 30 and/or intermediate layer 28 may be adapted to remove only a portion of sacrificial hardmask layer 36, remaining portions of sacrificial hardmask layer 36 may need to be, in some embodiments, removed during the patterning process of lower layer 26 and/or intermediate layer 28. As such, in some embodiments, portions of cap layer 34 may be removed while patterning lower layer 26 and/or intermediate layer 28. In some cases, patterning lower layer 26 and/or intermediate layer 28 may include reducing the thickness of cap layer 34 to a thickness between approximately 1200 angstroms and approximately 1500 angstroms. Reducing the thickness of cap layer 34 to such a thickness may be particularly advantageous in an embodiment in which a self-aligned contact is to be subsequently formed adjacent to the patterned stack of layers. Larger or smaller thicknesses of cap layer 34 may be formed, however, depending on the design specifications of the device. For example, in some embodiments, the thickness of the cap layer 34 may be reduced to a thickness of approximately 100 angstroms of greater.

Consequently, semiconductor structure 48 containing patterned portions of lower layer 26, intermediate layer 28, upper layer 30, and cap layer 34 may be formed as shown in FIG. 9. In some embodiments, semiconductor structure 48 may include a gate structure or an interconnect line, for example. In either case, the patterning processes of stack of layers 32 may include forming structure corners that are substantially square or are formed with substantially right angle dimensions. In other words, the patterning processes of stack of layers 32 may form corners 47 that are substantially less rounded than structures formed using conventional patterning processes. The rounded profile of a structure corner formed using conventional patterning processes is outlined by dotted line 49 in FIG. 9. The illustration of dotted line 49 is used for comparison to the profile of corners 47 only, and therefore is not included in semiconductor structure 48.

In general, an inherent characteristic of the etching process used during a patterning process includes rounding the upper peripheral edges of a patterned structure, particularly structures having a dielectric as an upper layer. The inclusion of sacrificial hardmask layer 36 in the method described herein, however, may help in preventing or reducing the formation of such rounded edges. As a result, corners 47 may be formed with a substantially square peripheral profile. As will be explained in more detail below, the substantially square periphery of corners 47 may advantageously allow self-aligned spacers to be formed at a greater thickness along the sidewalls of semiconductor structure 48 than along sidewalls of a structure having rounded corners. In particular, the substantially square corners may allow a greater thickness of spacers to be formed along the upper portion of semiconductor structure 48 than along an upper portion of a semiconductor structure formed using conventional patterning techniques. Consequently, a self-aligned contact structure may be formed at a greater distance from the conductive portion of semiconductor structure 48 as described in more detail below.

Figure 10:
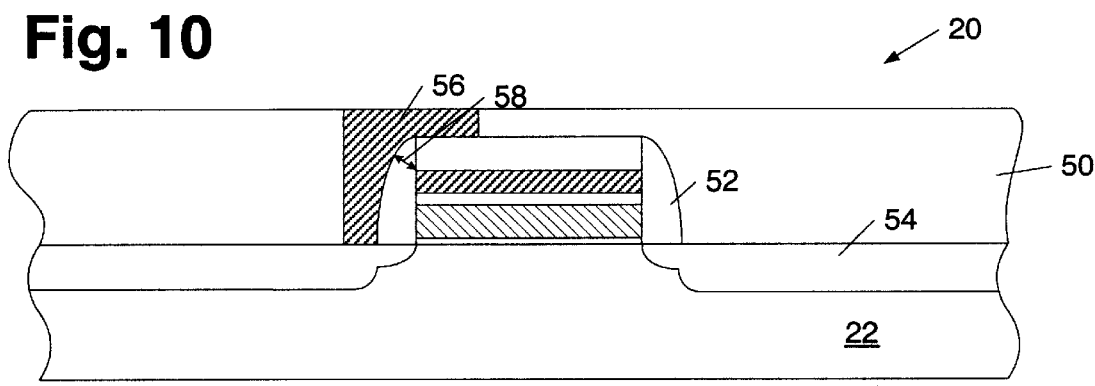
FIG. 10 depicts a partial cross-sectional view of the semiconductor topography in which spacers, an interlevel dielectric, and a contacted are formed self-aligned to the remaining portions of the stack of layers subsequent to the removal of the exposed portions of the lower portion of the stack of layers in FIG. 9.

Accordingly, semiconductor topography 20 may be further processed subsequent to the formation of semiconductor structure 48. For example, interlevel dielectric 50 may be deposited and planarized about semiconductor structure 48 as shown in FIG. 10. In some embodiments, dielectric 24 may be patterned prior to the deposition of interlevel dielectric 50. In other embodiments, however, dielectric 24 may not be patterned prior to the deposition of interlevel dielectric 50. In an embodiment in which semiconductor structure 48 is a gate structure, spacers 52, source and drain regions 54, and contact 56 may be formed self-aligned to semiconductor structure 48 as shown in FIG. 10. The formation of such a self-aligned contact structure is further described and referenced in U.S. Pat. No. 5,861,676. Alternatively, contact 56 may be spaced apart from semiconductor structure 48.

As noted above, spacers 52 may be formed at a greater thickness along the upper portions of semiconductor structure 48, than along a semiconductor structure formed using conventional patterning techniques. Consequently, self-aligned contact 56 may be spaced apart from semiconductor structure 48 by a greater distance than a contact formed self-aligned to a semiconductor structure patterned using conventional processes. In particular, self-aligned contact 56 may be spaced apart from upper layer 30 by distance 58 as shown in FIG. 10. In some cases, distance 58 may be greater than or equal to one and a half times the distance between similarly sized components of a semiconductor topography formed using conventional techniques. For example, in an embodiment in which the distance between an upper portion of a conventionally formed semiconductor structure and a self-aligned contact structure is approximately 250 angstroms, distance 58 of a structure formed using the method described herein may be greater than or equal to approximately 380 angstroms. In general, distance 58 may be between approximately 250 angstroms and 500 angstroms. However, larger or smaller dimensions of distance 58 may be appropriate depending on the design specifications of the device.

In either embodiment, cap layer 34 may serve as an etch stop layer during the formation of spacers 52 as explained in more detail above in reference to FIG. 1. In some cases, cap layer 34 may include a thickness, for example, that is equal to or greater than approximately 1100 angstroms subsequent to forming the spacers. Such an optimization of thickness of cap layer 34 may be particularly advantageous in an embodiment in which a self-aligned contact is to be subsequently formed adjacent to the patterned stack of layers. Other thicknesses of cap layer 34, however, may be obtained, depending on the design specifications of the fabrication process. For example, in some embodiments, cap layer 34 may include a thickness, for example, that is equal to or greater than approximately 100 angstroms subsequent to forming the spacers. Alternatively, spacers 52, source and drain regions 54, and contact 56 may not be formed.

It will be appreciated to those skilled in the art having the benefit of this disclosure that this invention is believed to provide a method for processing a semiconductor topography. In particular, the method may include patterning a plurality of layers spaced below a sacrificial hardmask layer. In this manner, the method may include minimizing the removal of a hardmask layer adapted to remain within the semiconductor topography for further processing. Further modifications and alternative embodiments of various aspects of the invention will be apparent to those skilled in the art in view of this description. For example, the method described herein may used for the formation of any semiconductor structure comprising a plurality of layers. In addition, the method described herein may be particularly advantageous in devices including sub-micron features. It is intended that the following claims be interpreted to embrace all such modifications and changes and, accordingly, the drawings and the specification are to be regarded in an illustrative rather than a restrictive sense.

What is claimed is:

1. A method for processing a semiconductor topography, comprising:
   depositing a sacrificial hardmask layer above a lower hardmask layer arranged above a stack of layers;
   patterning the sacrificial hardmask layer in alignment with a patterned photoresist mask formed upon the deposited sacrificial hardmask layer;
   patterning an upper portion of the stack of layers using the patterned sacrificial hardmask layer as a first mask prior to etching layers within a lower portion of the stack of layers, wherein the step of patterning the upper portion comprises removing the sacrificial hardmask layer; and
   subsequently patterning the lower portion of the stack of layers using the lower hardmask layer as a second mask.

2. The method of claim 1, further comprising:
   patterning the lower hardmask layer in alignment with the patterned sacrificial hardmask layer prior to patterning the upper portion of the stack of layers.

3. The method of claim 2, further comprising removing the photoresist mask prior to the step of patterning the lower hardmask layer.

4. The method of claim 2, further comprising removing the photoresist mask subsequent to the step of patterning the lower hardmask layer.

5. The method of claim 2, further comprising removing the photoresist mask while performing the step of patterning the lower hardmask layer.

6. The method of claim 1, wherein the sacrificial hardmask layer is adapted to reduce variations in a reflected signal during the formation of the photoresist mask.

7. The method of claim 1, wherein the upper portion comprises metal.

8. The method of claim 1, wherein the lower portion comprises polysilicon.

9. A method for processing a semiconductor topography, comprising:
   etching a plurality of layers in alignment with a bilayer hardmask arranged upon the plurality of layers, wherein the bilayer hardmask comprises a lower hardmask layer patterned in alignment with an overlying sacrificial hardmask layer, and wherein the step of etching the plurality of layers comprises;
   entirely removing the overlying sacrificial hardmask layer; and
   reducing the thickness of the lower hardmask layer to a thickness of approximately 100 angstroms or greater;
   depositing a dielectric layer upon the lower hardmask layer subsequent to the step of reducing the thickness of the lower hardmask layer.

10. The method of claim 9, wherein the step of reducing the thickness of the lower hardmask layer comprises reducing the thickness of the lower hardmask layer to between approximately 1200 angstroms and approximately 1500 angstroms.

11. The method of claim 9, wherein the step of etching the plurality of layers comprises:

patterning one or more upper layers of the plurality of layers, wherein the step of patterning the one or more upper layers comprises exposing the semiconductor topography to an etch chemistry that is more etch selective to the overlying sacrificial hardmask layer than the one or more upper layers; and patterning a lower layer of the plurality of layers, wherein the step of patterning the lower layer comprises exposing the semiconductor topography to an etch chemistry that is substantially equally etch selective to the overlying sacrificial hardmask layer and the lower layer.

12. The method of claim 9, wherein the step of etching the plurality of layers comprises forming a gate structure, wherein the method further comprises forming spacers aligned to sidewalls of the gate structure, and wherein the lower hardmask layer comprises a thickness equal to or greater than approximately 1100 angstroms subsequent to the step of forming the spacers.

13. The method of claim 12, further comprising forming a contact structure self-aligned with the spacers.

14. The method of claim 9, wherein the sacrificial hardmask layer comprises a thickness between approximately 100 angstroms and approximately 2000 angstroms prior to the step of etching the plurality of layers.

15. A method for processing a semiconductor topography, comprising:

patterning a sacrificial hardmask layer in alignment with a patterned photoresist mask;

patterning a lower hardmask layer in alignment with the patterned sacrificial hardmask layer, wherein the step of patterning the lower hardmask layer comprises removing the photoresist mask;

patterning an upper portion of a stack of layers arranged beneath the lower hardmask layer using the patterned sacrificial hardmask layer as a first mask, wherein the step of patterning the upper portion comprises removing at least a portion of the sacrificial hardmask layer; and patterning a lower portion of the stack of layers subsequent to the step of patterning the upper portion of the stack of layers using the lower hardmask layer as a second mask.

16. The method of claim 15, wherein the step of patterning the upper portion comprises removing an entirety of the sacrificial hardmask layer.

17. The method of claim 15, wherein the step of patterning the lower portion of the stack of layers comprises reducing the thickness of the lower hardmask layer to an amount between approximately 1200 angstroms and approximately 1500 angstroms.

18. The method of claim 15, wherein the steps of patterning the upper and lower portions of the stack of layers comprises forming a gate structure, wherein the method further comprises forming spacers aligned to sidewalls of the gate structure, and wherein the lower hard mask layer comprises a thickness equal to or greater than approximately 1100 angstroms subsequent to the step of forming the spacers.

19. The method of claims 18, further comprising forming a contact structure self-aligned with the spacers.

20. The method of claim 15, wherein the sacrificial hard mask layer comprises a material having substantially different etch characteristics than the upper portion of the stack of layers and substantially similar etch characteristics than the lower portion of the stack of layers.

* * * * *

UNITED STATES PATENT AND TRADEMARK OFFICE
CERTIFICATE OF CORRECTION

PATENT NO. : 6,682,996 B1
DATED : January 27, 2004
INVENTOR(S) : Blosse

It is certified that error appears in the above-identified patent and that said Letters Patent is hereby corrected as shown below:

Column 16,
Line 60, please delete ";" and insert therefor -- : -- after "comprises."

Column 18,
Line 26, please delete "hard mask" and substitute therefor -- hardmask --.

Signed and Sealed this

Twelfth Day of October, 2004

JON W. DUDAS
*Director of the United States Patent and Trademark Office*